(12) United States Patent
Nam et al.

(10) Patent No.: US 9,222,190 B2
(45) Date of Patent: Dec. 29, 2015

(54) 3-DIMENSIONAL NANOPARTICLE ASSEMBLY STRUCTURE AND GAS SENSOR USING SAME

(71) Applicants: SNU R&DB Foundation, Seoul (KR); Global Frontier Center for Multiscale Energy Systems, Seoul (KR)

(72) Inventors: Woongsik Nam, Gwacheon-si (KR); Yongjun Bae, Seoul (KR); Man Soo Choi, Seoul (KR)

(73) Assignees: SNU R&DB Foundation, Seoul (KR); Global Frontier Center for Multiscale Energy Systems, Seoul (KR)

( * ) Notice: Subject to any disclaimer, the term of this patent is extended or adjusted under 35 U.S.C. 154(b) by 30 days.

(21) Appl. No.: 14/155,039

(22) Filed: Jan. 14, 2014

(65) Prior Publication Data

US 2014/0193325 A1 Jul. 10, 2014

Related U.S. Application Data

(63) Continuation-in-part of application No. PCT/KR2013/001703, filed on Mar. 4, 2013.

(30) Foreign Application Priority Data

Jul. 13, 2012 (KR) .................... 10-2012-0076893

(51) Int. Cl.
| | |
|---|---|
| G01N 27/00 | (2006.01) |
| G01N 31/22 | (2006.01) |
| C25D 13/02 | (2006.01) |
| C23C 14/04 | (2006.01) |
| B82B 3/00 | (2006.01) |
| C01G 3/02 | (2006.01) |
| C23C 14/32 | (2006.01) |
| C23C 14/58 | (2006.01) |

(52) U.S. Cl.
CPC .............. *C25D 13/02* (2013.01); *B82B 3/0047* (2013.01); *C01G 3/02* (2013.01); *C23C 14/042* (2013.01); *C23C 14/32* (2013.01); *C23C 14/5853* (2013.01)

(58) Field of Classification Search
CPC ............................... G01N 27/00; G01N 31/22
See application file for complete search history.

(56) References Cited

U.S. PATENT DOCUMENTS

| | | | |
|---|---|---|---|
| 2005/0237834 A1 | 10/2005 | Bozano et al. | |
| 2007/0101823 A1 | 5/2007 | Sen et al. | |
| 2007/0228583 A1* | 10/2007 | Islam et al. | .................. 257/784 |

FOREIGN PATENT DOCUMENTS

| | | |
|---|---|---|
| CN | 102134091 A | 7/2011 |
| CN | 102381726 A | 3/2012 |
| JP | 2004-207562 | 7/2004 |
| JP | 2008-080461 | 4/2008 |

(Continued)

OTHER PUBLICATIONS

Kanan et al., "Semiconducting Metal Oxide Based Sensors for Selective Gas Pollutant Detection," Sensors 9:8158-8196 (2009).

(Continued)

*Primary Examiner* — Timothy Vanoy
(74) *Attorney, Agent, or Firm* — Dardi & Herbert, PLLC; Peter S. Dardi (57) ABSTRACT

The present invention provides a 3-dimensional nanoparticle structure, wherein a plurality of structures formed by assembling nanoparticles is connected to form a bridge, and a gas sensor using the same.

5 Claims, 7 Drawing Sheets

(56) References Cited

FOREIGN PATENT DOCUMENTS

| KR | 10-2006-0042144 A | 5/2006 |
|---|---|---|
| KR | 10-2008-0051754 A | 6/2006 |
| KR | 10-0740984 B1 | 7/2007 |
| KR | 10-2008-0010663 A | 1/2008 |
| KR | 10-0907787 B1 | 7/2009 |
| KR | 10-2009-0089787 A | 8/2009 |
| KR | 10-2009-0132488 A | 12/2009 |
| KR | 10-2010-0068777 A | 6/2010 |
| KR | 10-2010-0105023 A | 9/2010 |
| KR | 10-2010-0138089 A | 12/2010 |
| KR | 10-1109195 B1 | 1/2012 |
| KR | 10-2012-0038472 A | 4/2012 |
| WO | 2005/115088 A2 | 12/2005 |

OTHER PUBLICATIONS

Messing et al. "Generation of Pd Model Catalyst Nanoparticles by Spark Discharge," J Phys Chem C 114:9257-9263 (2010).
Tabrizi et al., "Generation of nanoparticles by spark discharge," J Nanopart Res 11:315-332 (2009).
Vons et al., "Silicon nanoparticles produced by spark discharge," J Nanopart Res 13:4867-4879 (2011).
Search Report for International Application No. PCT/KR2013/001703, mailed Jun. 27, 2013.
Korean office action for corresponding Korean application No. 201380002955.4 dated Jan. 30, 2015 (10 pages with translation).

\* cited by examiner

3-DIMENSIONAL NANOPARTICLE ASSEMBLY STRUCTURE AND GAS SENSOR USING SAME

CROSS REFERENCE TO RELATED APPLICATIONS

This application is a continuation-in-part of copending PCT application PCT/KR2013/001703 filed on Mar. 4, 2013 to Nam et al., which claims priority to Republic of Korea patent application 10-2012-0076893 filed on Jul. 13, 2012 to Nam et al., both of which are incorporated herein by reference.

FIELD OF THE INVENTION

The present invention relates to a novel nanoparticle structure and a gas sensor using the same.

BACKGROUND OF THE INVENTION

In general, a gas sensor is a device which uses the change of electrical specific resistance of a semiconductor resulting from the density change of conducting electrons on the semiconductor surface, attributed to chemical interaction between chemical species and the semiconductor surface. As one example of the change of electrical resistance, when a metal oxide semiconductor such as zinc oxide (ZnO), tin oxide ($SnO_2$), tungsten oxide ($WO_3$) and titanium oxide ($TiO_2$) is in contact with an exterior gas ingredient such as $H_2$, CO, $O_2$, NOx, $CO_2$, DMMP, $CH_4$ and $NH_3$, the gas ingredient is adsorbed on the surface of the metal oxide semiconductor, which causes oxidation/reduction reaction on the surface of the metal oxide semiconductor, and thereby the electrical specific resistance of the metal oxide semiconductor changes.

More specifically, when the metal oxide semiconductor is n-type and is exposed to oxidative chemical species such as $O_2$ molecule, and thereby the oxidative chemical species are adsorbed on the surface, the metal oxide semiconductor loses electrons to the oxidative chemical species, resulting in forming a depletion zone on the surface. Accordingly, the electrical resistance increases. On the other hand, the metal oxide semiconductor is n-type and is exposed to reductive chemical species such as $H_2$ or $CO_2$ molecule, and thereby the reductive chemical molecule is adsorbed on the surface, the $H_2$ or $CO_2$ molecule is combined to the oxygen, already adsorbed on the surface of the metal oxide semiconductor, which turns to $H_2O$ or $CO_2$ and then become separated from the metal oxide semiconductor. Accordingly, the electrons bound to the separated oxygen are excited and then shift to a conduction band of the metal oxide semiconductor, and therefore the resistance of the metal oxide semiconductor decreases.

Recently, studies, with the aim of manufacturing and applying many kinds of metal oxide semiconductors in the forms of various nano structures, such as nanofiber, nanorod, nanotube, nanoribbon and the like, are actively under way. The reason is that, compared with the existing bulk or thin-film materials, the nano-sized materials display different varying superior physical and chemical properties. Actually, nano-materials display quantum size effect, and therefore there are attempts for applying nano-materials to a nanoelectronic device. And, they have an advantageous characteristic for sensing many types of chemical species due to its large surface area to volume ratio and, therefore, there are attempts for applying nano-materials to a nano gas sensor and the like.

Specifically, Korean Patent Publication No. 10-2006-0042144 discloses a carbide or nitride-based electron field emitter having a nano-sized pointed tip emitter structure, as a metal oxide nanostructure manufactured by using a carbon nanostructure as a template.

Further, Korean Patent Publication No. 10-2010-0105023 relates to a gas sensor using a metal oxide nanorod, and suggests a method for manufacturing a gas sensor by forming a metal oxide film on the nano-template surface and removing the nano-template, thereby forming a pipe-shaped metal oxide nanorod.

On the other hand, a core-shell type nanofiber structure was also suggested and, particularly, Korean Patent Publication No. 10-2010-0138089 suggested a method for manufacturing a core-shell nanofiber network structure comprising a metal oxide by the two steps of electrospinning method and atomic layer deposition method.

SUMMARY OF THE INVENTION

Nanostructures having various 3-dimensional shapes are being studied and developed as a gas sensor and, therefore, the present invention is objected to provide a novel nanoparticle assembly structure and a gas sensor using the same.

In order to accomplish one object of the present invention, the present invention provides a 3-dimensional nanoparticle structure, wherein a plurality of structures formed by assembling nanoparticles is connected to form a bridge.

According to one preferred embodiment of the present invention, a plurality of structures formed by assembling nanoparticles has petal shape, and the neighboring petals are connected to form a bridge. However, the nanoparticle structures are not limited only to the flower shape, and can be controlled to various shapes by changing patterns.

According to one preferred embodiment of the present invention, the nanoparticles may be metal nanoparticles, and also the nanoparticles may be metal oxide nanoparticles for being used as a gas sensor.

The nanoparticle structure according to the present invention can be manufactured by a method comprising the steps of:

1) locating a substrate, which has a micro/nano pattern formed by a mask layer having a perforated pattern, in a reactor, and then applying an electric field;

2) forming charged nanoparticles and ions by spark discharging nanoparticle precursors in a spark discharge chamber; and 3) introducing the charged nanoparticles and ions into the reactor, and then focused-depositing the particles thereof at the perforated part of the micro/nano pattern of the substrate.

In one preferred embodiment of the present invention, before conducting the spark discharge of the step 2), a step of generating ions by corona discharge and then accumulating the ions on the micro/nano pattern of the substrate, located in the reactor, may further included.

The metal oxide nanoparticle structure may be manufactured by heating the metal nanoparticle structure manufactured by the above method under oxygen-containing atmosphere.

In this description, the term "micro/nano pattern" refers to a several nm to tens of μm pattern in the beam, and the micro/nano pattern may have various shapes; and the term "nanoparticle structure" refers to a structure with broad range of diameter from several nm to several μm, which contains a molecular level cluster and is formed by the accumulation of nanoparticles of several nm to several μm diameter.

Advantageous Effects of the Invention

According to the present invention, a 3-dimensional nanoparticle structure, which is useful as a gas sensor, can be manufactured by a simple and effective method. The nanoparticle structure according to the present invention is expected to be used as a superior gas sensor due to its excellent sensitivity and response speed against reacting gas.

BRIEF DESCRIPTION OF DRAWINGS

The above and other objects and features of the present invention will become apparent from the following description of the invention taken in conjunction with the following accompanying drawings, which respectively show.

DETAILED DESCRIPTION OF THE INVENTION

Hereinafter, the present invention will be described in detail with reference to the accompanying drawings.

Figure 1:
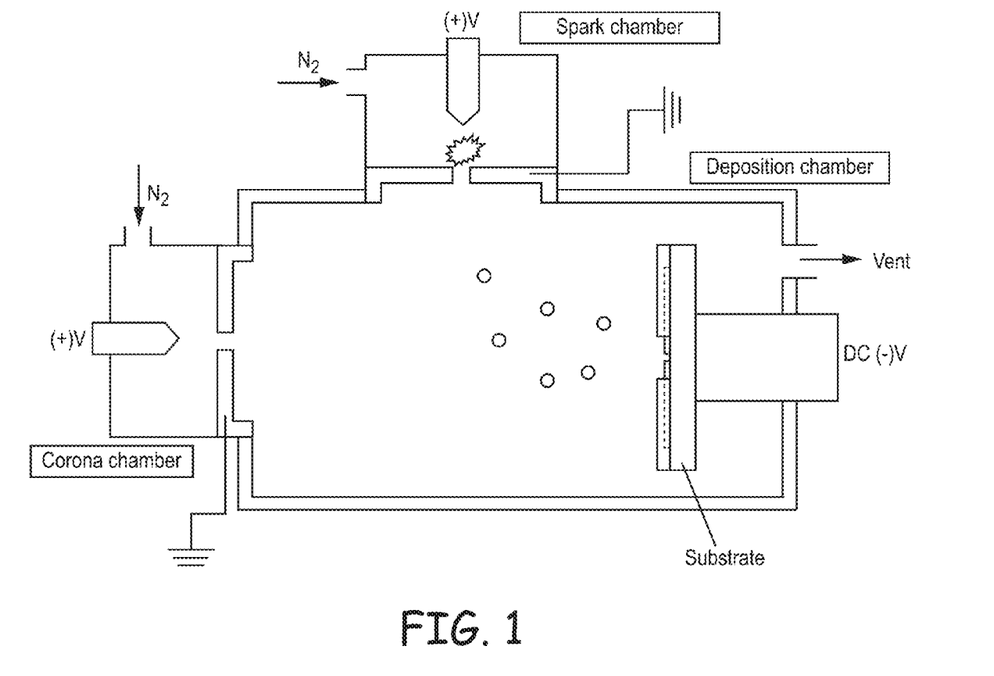
FIG. 1 illustrates a device for manufacturing a 3-dimensional structure assembled with nanoparticles according to one embodiment of the present invention.

FIG. 1 illustrates a device for assembling a 3-dimensional structure, which will be used as a gas sensor, with nanoparticles according to the present invention.

As disclosed in Korean Patent Publication No. 10-2009-0089787 (Published on Aug. 24, 2009), a 3-dimensional nanoparticle structure can be effectively manufactured regardless of polarity of nanoparticles or ions, by generating bipolar charged nanoparticles and ions simultaneously through spark discharge, by inserting the particles and ions thereof into a reactor where a pattern-formed substrate exists, and then by applying an electric field thereto.

A substrate, which has a micro/nanopattern by a mask layer having a perforated pattern, is located on the electrode of a reactor (deposition chamber), whose body is earthed and whose inside is equipped with the electrode; and then an electric field is formed inside the reactor by applying voltage, preferably from −5 kV to 5 kV, more preferably by applying voltage from −0.5 kV to −5 kV to positively charged particles, through a voltage supply means, so as to make the polarity of the field opposite to that of the charged nanoparticles which are desired to be deposited on the electrode.

At this time, the mask layer having the micro/nanopattern may be formed by patterning a photoresist or a dielectric by a conventional photo process or an electron beam-lithography process, or by closely adhering the patterned-mask having a dielectric surface on the substrate. The photoresist and the substrate used in the present invention may be conventional things, and the surface of the substrate may be a conductive material, a semi-conductive material or a non-conductive material.

As illustrated in FIG. 1, the spark discharge chamber is preferred to have pin-to-plate structure rather than rod-to-rod structure for generating nanoparticles. Further, the corona discharge chamber is illustrated in FIG. 1, but it is not essential. It may be beneficial to use corona discharge for forming an electrostatic lens because ions are introduced into the reactor and accumulated on the non-conductive mask layer prior to nanoparticles.

In general, because electrical mobility of gas ion is larger than electrical mobility of nanoparticle aerosol, and the ions inserted by corona discharge are enough, the ions arrive at the substrate in advance, and then accumulate electric charge on the surface of the photoresist pattern layer. For example, when the positive ions accumulate electric charge on the surface of the photoresist pattern layer in advance, a convex-type equipotential line is generated by the action of the accumulated positive ions and the electric field formed inside the reactor. And then, to the direction perpendicular to the equipotential line, the positively charged nanoparticles move to the center of the micro/nanopattern and are then focused and deposited to form a nanoparticle structure. Further, when the direction of the electric field is changed, the particles of the opposite polarity and the ions are induced, and, therefore the nanoparticles of the opposite polarity can be deposited on the micro/nanopattern.

Materials for forming metal nanoparticles may be metal such as copper, tin, silver, zinc, platinum, palladium, gold, indium and cadmium, but not limited thereto, and any precursor materials, which can be used as a chemical sensor, can be used without limitation. Namely, a sensor, wherein reaction materials are structurally mixed, can be manufactured by depositing any one, or two, or more materials selected from the above materials together or sequentially, and a sensor, wherein various materials are mixed, can be manufactured by depositing a catalyst or other reaction materials together or sequentially. The method of the present invention can manufacture the sensors having mixed structure simply and effectively by only exchanging the materials generating particles in the middle or at the end of deposition (for example, exchanging copper, platinum and copper in order).

The spark discharge can be conducted by applying voltage of 5 to 10 kV, and the corona discharge can be conducted by applying voltage of 1 to 10 kV. Further, it is more preferred to apply negative (−) voltage of 0.5 to 5 kV to the substrate.

The size of the nanoparticles generated by spark discharge may be controlled from 1 to 50 nm, and it may be 1 to 20 nm preferably, and 3 to 10 nm most preferably. According to one preferred embodiment of the present invention, in the case of copper, nanoparticles with the diameter of 3 nm or less may be generated.

Figure 2:
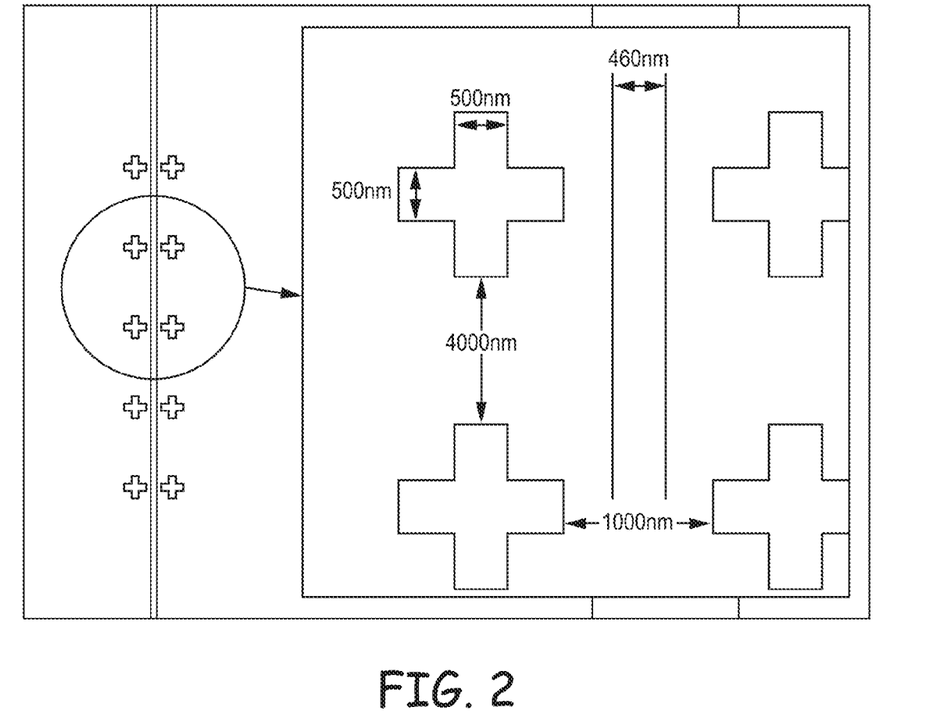
FIG. 2 illustrates micro/nano patterns according to one embodiment of the present invention.

The non-conductive mask layer on the substrate may have any pattern without a limit, if the pattern is advantageous for assembling a bridge-shape structure. FIG. 2 shows examples of cross-shape patterns. The size and shape of the pattern can be variously controlled depending on deposition condition.

The deposition time may be enough if 3-dimensional structure can grow to form a bridge with a neighboring structure. For example, it may be 1 to 4 hours, and more preferably 1 hour 30 min to 2 hour 30 min.

The metal nanoparticle structure manufactured as described above (for example, FIG. 3 and FIG. 4) is needed to be converted to metal oxide by oxidation treatment (pretreatment), to act as a gas sensor. Accordingly, when a 3-dimensional structure having the desired shape is formed by depositing nanoparticles on a substrate, a step of heating under oxygen or air atmosphere, preferably at 250~400° C. for 60~180 min, is conducted.

The structure according to the present invention is advantageous because it can maximize reaction area with reaction gas by forming 3-dimensional shape having wide surface area (for example, flower shape), and by being connected to neighboring structures in the form of a bridge. Further, it shows superior reactivity against reaction gas as the particles forming a structure are getting much smaller.

Namely, the method of the present invention can maximize reactivity against reaction gas by increasing surface through employing 3-dimensional structure and by using nano-sized particles, while not using the existing methods which use a template, or attach or fill with particles.

Hereinafter, the present invention will be described in further detail with reference to examples, and the scope of the present invention cannot be limited thereby in any way.

Example 1

A substrate for a gas sensor was prepared by forming electrodes (Au/Ti layer, thickness: 50 nm) with the space of 460 nm on a dielectric layer (SiO2 layer, thickness: 2 micron). A mask layer having a perforated pattern of FIG. 2 (SiO2 mask layer or PR mask layer, thickness: 0.1 micron) is placed such that the electrodes are exposed by the perforated pattern. The resulting substrate with a dielectric layer, exposed electrodes, and a mask layer is equipped into the device illustrated in FIG. 1, and copper nanoparticles are focused-deposited under the following conditions. The size of the copper nanoparticles generated by spark discharge was 2 to 3 nm.

In the following Table, Applied Voltage for ion deposition condition for forming an electrostatic lens is for a corona discharge chamber, and Applied Voltage for nanoparticle focused deposition condition is for a spark discharge chamber.

TABLE 1

| Variable | Ion Deposition Condition for Forming Electrostatic Lens | Nanoparticle Focused Deposition Condition |
| --- | --- | --- |
| Applied Voltage (kV) | 2.7 | 5 |
| Substrate Voltage (kV) | −2 | −1 |
| Carrier Gas | $N_2$ | $N_2$ |
| Carrier Gas Flow Rate (lpm) | 3 | 1.5 |
| Deposition Time (min) | Longer than 10 min | Longer than 1 hr 40 min |

Figure 3:
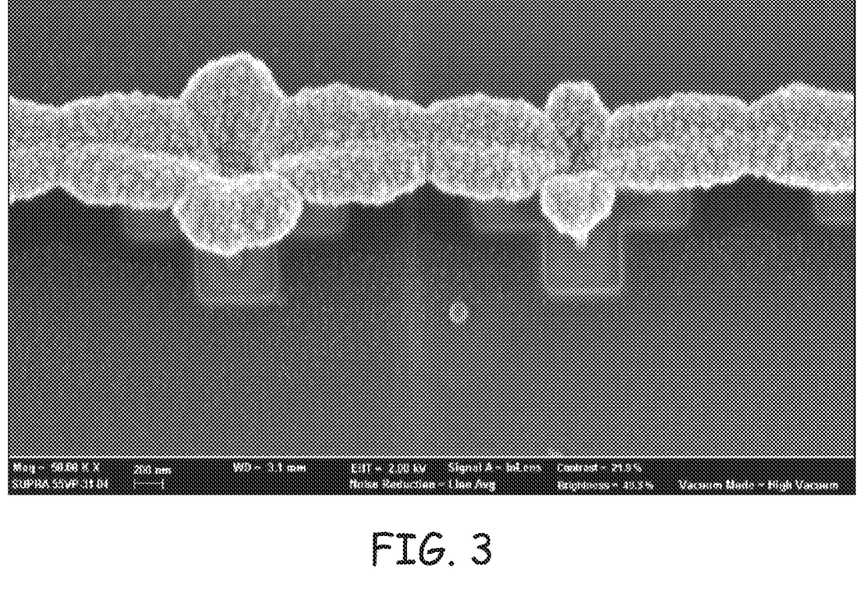
FIG. 3 is a SEM image showing that focused nanoparticles are forming a bridge according to the present invention.
Figure 4:
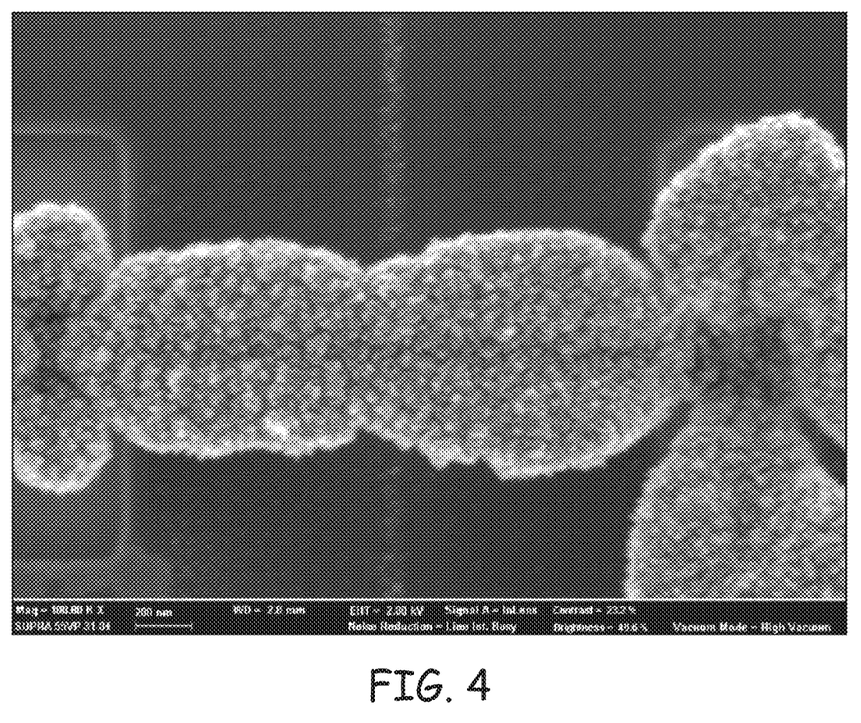
FIG. 4 is a partially magnified image of the image of FIG. 3.

When the ion deposition using the corona chamber was completed, particles are generated in a spark chamber. As a result, the exposed electrodes are electronically connected to each other by a nanoparticle structure having bridge shape formed by neighboring petals connected to each other, and SEM images thereof are shown in FIGS. 3 and 4.

Example 2

Figure 5:
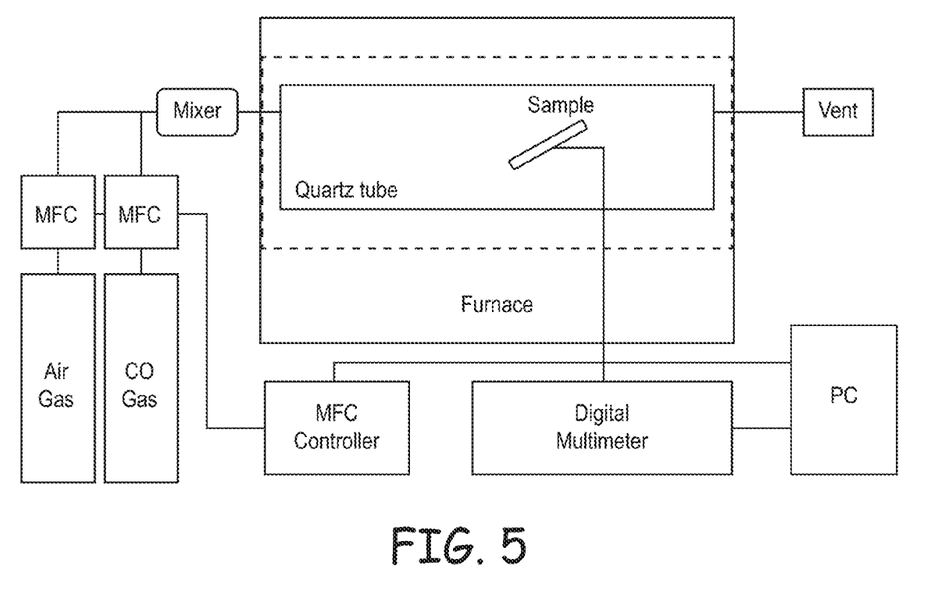
FIG. 5 illustrates a device for testing the performance of a gas sensor in Example of the present invention.

The 3-dimensional structure obtained in Example 1 was located in a quartz pipe of the device illustrated in FIG. 5, and installed in an electric furnace. In order to oxidize metal nanoparticles, and to induce sintering between particles, the nanoparticles are converted to oxides by heating the particles thereof from room temperature to 300° C. for 1 hour while flowing oxygen or air with 500 sccm and keeping them hereof at 300° C. for 2 hrs or more.

Figure 6:
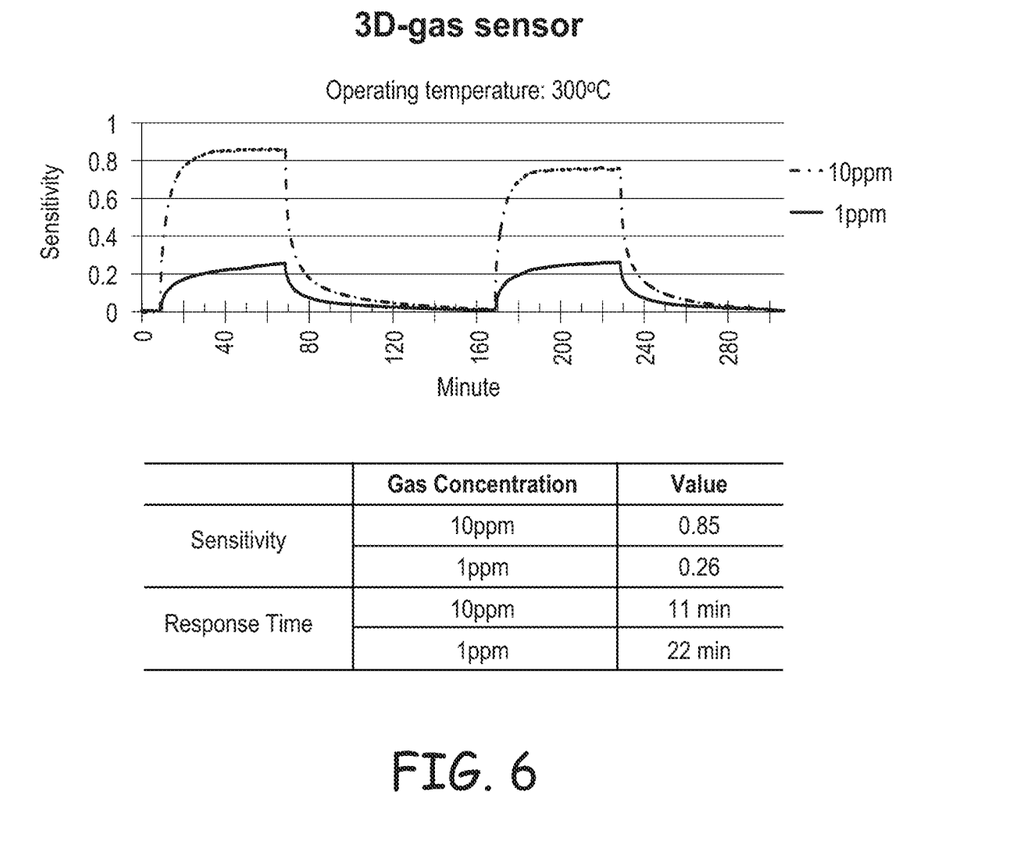
FIGS. 6 and 7 show results from gas sensor test in Example of the present invention.

Then, in order to test the performance of the gas sensor, reaction gas (carbon monoxide) and air were mixed with proper volume ratio at 300° C. to the desired carbon monoxide concentration to make total flow rate 500 sccm. FIG. 6 shows the result of measuring the sensitivity and the response time in the case of the carbon monoxide concentrations of 10 ppm and 1 ppm.

Example 3

Figure 7:
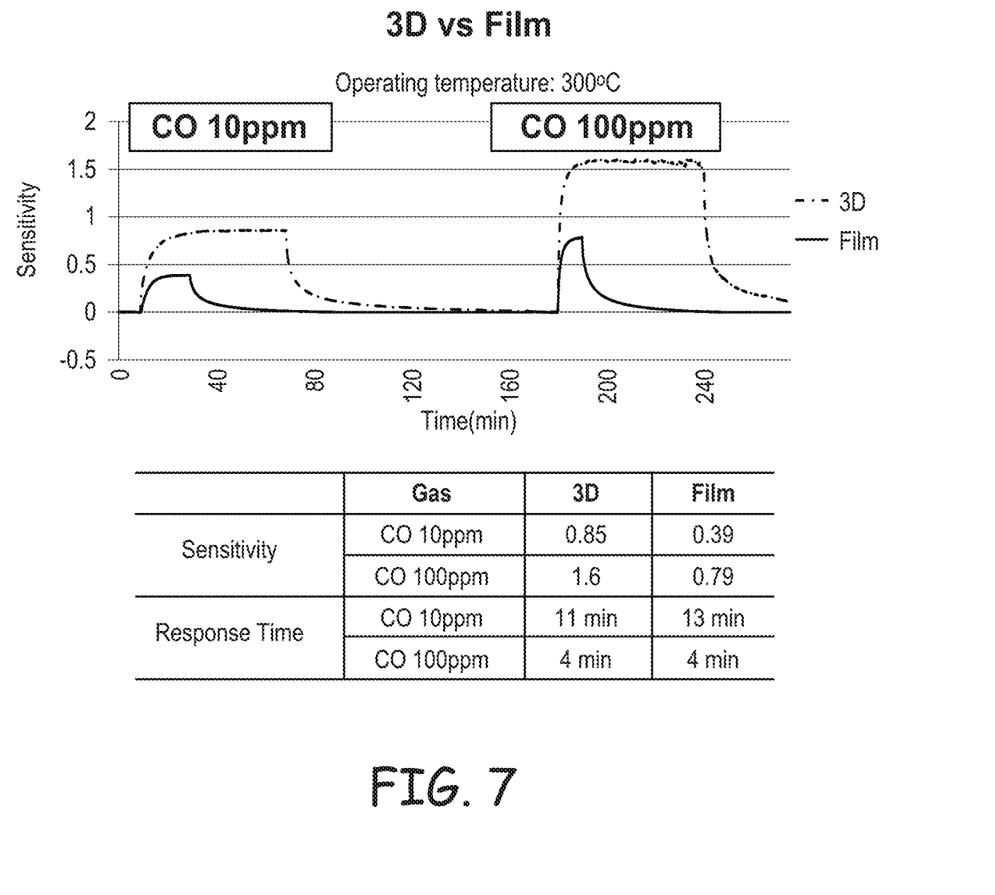

The method of Example 2 was repeated, and sensitivities of the 3-dimensional structure according to the present invention and a film were compared at the carbon monoxide concentrations of 10 ppm and 100 ppm. The result was shown in FIG. 7. As can be seen from FIG. 7, it can be found that the sensitivity and the response time of the structure according to the present invention are much better than the film.

Comparative Example

Sensitivities of known carbon monoxide sensors are as follows.

TABLE 2

| No. | Sensitivity | Gas | Operating Temperature | Ref. |
| --- | --- | --- | --- | --- |
| 1 | 9 | CO (400 ppm) | 320° C. | Y. Zhang et al./Sensors and Actuators B 128 (2007) 293-298 |
| 2 | 0.001 | CO (5 ppm) | RT | N. S. Ramgir, et al./Sensors and Actuators B 151 (2010) 90-96 |
| 3 | 0.16 | CO (10 ppm) | 370° C. | Y.-S. Kim et al./Sensors and Actuators B 135 (2008) 298-303 |

In the above Table 2, it can be found that the sensitivity of the conventional sensor against carbon monoxide 10 ppm (370° C.) was 0.16 at the most, while the sensitivity of the present invention (see FIG. 6 and FIG. 7) against carbon monoxide 10 ppm (300° C.) was outstandingly excellent as 0.85.

INDUSTRIAL APPLICABILITY

According to the present invention, a 3-dimensional nanoparticle structure, which is useful as a gas sensor, can be manufactured by a simple and effective method. The nanoparticle structure according to the present invention is expected to be used as an excellent gas sensor due to its superior sensitivity and response speed against reacting gas.

The specific embodiments above are intended to be illustrative and not limiting. Additional embodiments are within the broad concepts described herein. In addition, although the present invention has been described with reference to particular embodiments, those skilled in the art will recognize that changes can be made in form and detail without departing from the spirit and scope of the invention. All references cited above are incorporated herein by reference. Any incorporation by reference of documents above is limited such that no subject matter is incorporated that is contrary to the explicit disclosure herein.

What is claimed is:

1. A gas sensor using a 3-dimensional structure comprising a dielectric layer, two metal electrodes on the dielectric layer, and a plurality of structures formed by assembling metal or metal oxide nanoparticles forming a floating bridge between the two metal electrodes across the dielectric layer.

2. The 3-dimensional nanoparticle structure according to claim 1, wherein the plurality of structures formed by assembling metal or metal oxide nanoparticles has a petal shape, and the neighboring petals are connected to form a bridge.

3. A method for manufacturing a gas sensor using the nanoparticle structure of claim 1, which comprises the steps of:

1) positioning a substrate, which has a micro or nanopattern formed by a mask layer having a perforated pattern, in a reactor, and then applying an electric field;
2) generating charged nanoparticles and ions by spark discharging metal or metal oxide nanoparticle precursors in a spark discharge chamber; and
3) introducing the charged nanoparticles and ions into the reactor, and then focused-depositing the nanoparticles at the perforated part of the micro or nano pattern of the substrate to form the nanoparticle structure.

4. The method according to claim 3, which further comprises a step of generating ions by corona discharge, and then accumulating the ions on the micro or nano pattern of the substrate, which is located in the reactor, before conducting the step 2).

5. The method according to claim 3, which further comprises a step of heating the nanoparticle structure under oxygen-containing atmosphere.

* * * * *